United States Patent [19]

Atkinson et al.

[11] 4,095,192
[45] June 13, 1978

[54] RANDOM STATE GENERATOR

[75] Inventors: Edward E. Atkinson, Arlington, Va.; William E. Queen, Silver Spring, Md.

[73] Assignee: The United States of America as represented by the Secretary of the Army, Washington, D.C.

[21] Appl. No.: 715,933

[22] Filed: Mar. 25, 1968

[51] Int. Cl.² .......................................... H03B 29/00
[52] U.S. Cl. ..................................... 331/78; 307/240
[58] Field of Search ............... 307/239, 240, 244, 247, 307/269; 331/78

[56] References Cited

U.S. PATENT DOCUMENTS

| 3,054,003 | 9/1962 | Pagno et al. | 307/247 |
| 3,178,592 | 4/1965 | Fischer et al. | 307/247 X |
| 3,366,779 | 1/1968 | Catherall et al. | 331/78 X |

FOREIGN PATENT DOCUMENTS 1,417,309  10/1965  France.

OTHER PUBLICATIONS

General Electric, *Transistor Manual*, Sixth Edition, 1962, p. 122.

*Primary Examiner*—Nelson Moskowitz
*Attorney, Agent, or Firm*—John R. Utermohle

[57] ABSTRACT

A random state generator to determine a random non-return to zero (NRZ) voltage level at a particular clocked time with a noise generating diode or gas tube to provide a randomly fluctuating analogue voltage. The random voltages are amplified and applied to a transformer which acts as a gate for the random voltage. The secondary of the transformer has unidirectional conducting means connected to each of the ends and so poled that by applying a positive voltage pulse to a center tap on the secondary, the unidirectional current devices are forward biased and close the gate. The output of the transformer is connected to a bistable multivibrator which is thereby slaved to the random voltage polarity applied to its input during clock time.

4 Claims, 2 Drawing Figures

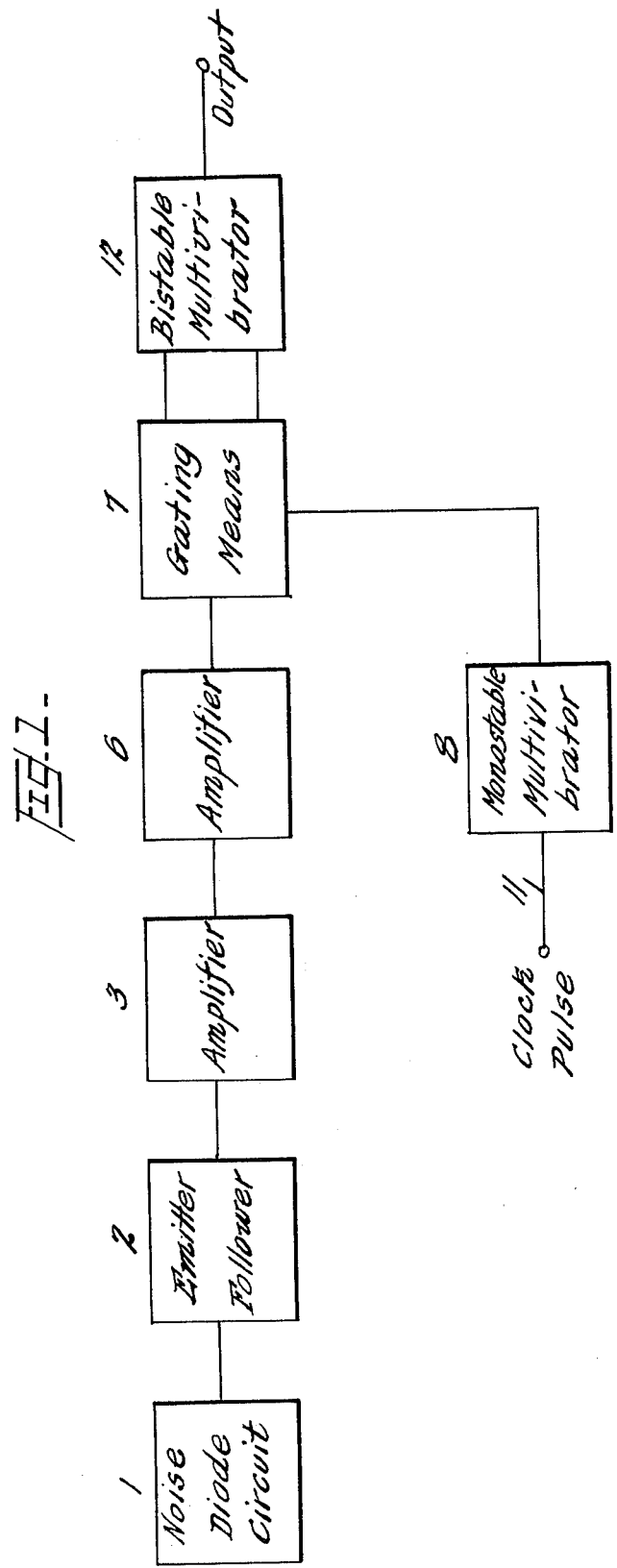

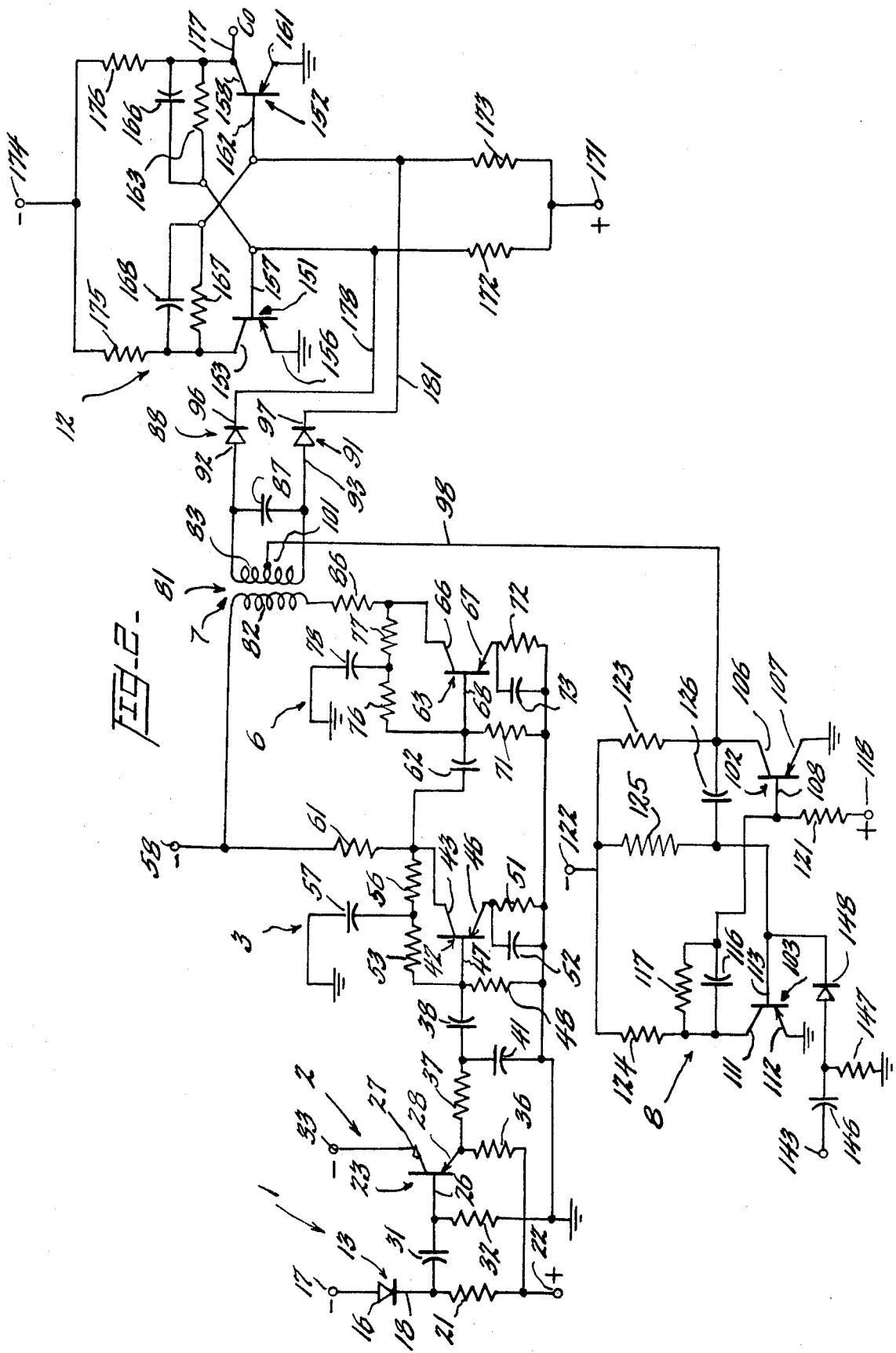

RANDOM STATE GENERATOR

BACKGROUND OF INVENTION

Many systems require the provision of a random voltage level at a particular time. For example, such a random voltage level could be used to simulate input test data for evaluation of data processors such as signal conditioners, bit synchronizers and digital correlators. It may also be utilized in digital communications equipment to perform a variety of functions. In such systems, it is necessary to have a randomly occurring event and to convert the randomly occurring event into a randomly occurring NRZ voltage level. A major problem is to insure that the random event is truly random; that is, the random event, assuming there are two possible random conditioners, has each condition occurring 50% of the time, and each condition is statistically independent of all other conditions. A further problem is to insure that the conversion means which converts the random occurring event into the random occurring voltage level does not distort the 50% probability, or the statistical independence, of any one of the random occurring conditions.

DESCRIPTION OF PRIOR ART

In prior art random state generators, no provision is made to insure that the conversion of the random occurring condition into the random occurring voltage level does not introduce a distortion of the 50% probability. Typical of the prior art is the provision of an analogue noise source which has its output amplified, clipped, and thereafter used as the input to standard logic gates which serve as input to a bistable multivibrator. In such an arrangement, quite often the clipped noise and the logic gates are biased in such a way as to cause the bistable multivibrator to favor a particular state and thereby distort the 50% probability.

SUMMARY OF INVENTION

An object of the present invention is to provide a new and improved random state generator and gating means.

Another object of the present invention is to provide a new and improved random state generator wherein provision is made to insure that the random occurring condition is truly random. That is, assuming there are two random conditions, the probability of any one condition occurring is 50%, and each condition is statistically independent of all other conditions.

Yet another object of the present invention is to provide a new and improved gating means which does not introduce a distortion into the output random voltage level.

Still another object of the present invention is to provide one means for both insuring that the random occurring condition is truly random and simultaneously preventing the introduction of distortion into the conversion of the random occurring condition into the random occurring voltage level.

With these and other objects in view, a random state generator and gating means may include means for generating a randomly varying voltage, the voltage having positive- and negative-going variations; gating means for controlling the flow therethrough of positive and negative variations; actuating means for opening and closing the gating means; and means connected to the output of the gating means, having two stable states, and controlled by the positive and negative variations for generating one of the two states.

More specifically, the gating means for controlling the flow of the randomly occurring voltage may include a transformer having a primary winding and a secondary winding with a secondary center tap connection; a power supply connected to one end of the primary winding; a transistor having its collector connected to the other end of the primary winding and its emitter being connected through an impedance to ground; and an impedance connecting the ends of the secondary winding, a first and second unidirectional device each having an anode and a cathode, the first anode being connected to one end of the secondary winding, and the other anode being connected to the other end of the secondary winding. Actuating means may be connected to the secondary center tap for providing pulses which are adapted to forward bias, during a portion of the pulse period, the two unidirectional devices and thereby permit a flow of current.

DESCRIPTION OF DRAWINGS

FIG. 1 is a block diagram of the random state generator and gating means; and

FIG. 2 is a schematic diagram of a preferred embodiment of the random state generator and gating means.

DETAILED DESCRIPTION OF PREFERRED EMBODIMENT

Referring now to FIG. 1, which is a block diagram of the random state generator and gating means, a noise generating diode circuit 1 is buffered from the entire system by an emitter follower 2. The output of the emitter follower 2 is passed through various amplification stages 3 and 6, and subsequently, the amplified signal is used as the input to a gating means 7. A monostable multivibrator 8 is an actuating means which produces a signal which closes the gating means 7. The monostable multivibrator 8 is triggered into its unstable state by a clock pulse applied to the multivibrator through a lead 11. When the multivibrator 8 is in its unstable state, the output is utilized to actuate and thereby close the gating means 7. During this period, a window is provided, that is, the gating means is opened, and the output from the amplifier 6 may pass through the gating means and into a bistable multivibrator 12. The output for the entire system is taken from the bistable multivibrator 12, and naturally, there are two different voltage levels obtainable. The output of the bistable multivibrator 12 is controlled by the polarity of the input. Consequently, the random polarity of the voltage of the noise diode has been converted into a random NRZ voltage.

Referring now to FIG. 2, which is a schematic diagram of the random state generator and gate system shown in block form in FIG. 1, a noise generating diode 13 has its anode 16 connected to a negative voltage supply 17. The cathode 18 of the noise generating diode 13 is connected through a resistor 21 to a positive voltage supply 22. The voltage developed at the cathode 18 of noise generating diode 13, which has positive- and negative-going variations, is utilized as the input to the emitter follower 2, shown in block form in FIG. 1. The emitter follower 2 is utilized to effect a high impedance to low impedance transfer to isolate the noise generating diode 13 from the rest of the system and, thereby, to prevent generating an undesired loading effect on the noise generating diode 13. The emitter follower 2 is in the standard configuration and consists of a transistor 23 having a base 26, a collector 27 and an emitter 28. A coupling capacitor 31 connects the cathode 18 to the base 26. A resistor 32 connects the junction of the capacitor 31 and the base 26 to ground. The collector electrode 27 is connected to a negative voltage supply 33, and the emitter 28 is connected to the positive voltage supply 22 by a resistor 36. For the present purpose, it is sufficient to say that the emitter follower 2 operates in standard fashion and thereby isolates the noise generating diode 13 from the rest of the system.

The output from the emitter follower 2 is utilized as the input to a newtork passive filter comprising a resistor 37, a capacitor 38 and a capacitor 41. This network performs a partial filter function and filters out a portion of the power spectrum of the noise generating diode 13 to achieve a better amplitude-time distribution of the voltage; that is, a more gaussian amplitude distribution. This assures that the portion of the power spectrum utilized in the remainder of the system is that portion of the noise generating diode power spectrum which has the most desirable random voltage characteristics. Further filtering is accomplished in a tuned transformer, to be described in greater detail herein below. The purpose of the filtering, in general, is to convert the non-gaussian amplitude distribution of the noise voltage from the noise generating diode to a gaussian amplitude distribution. This allows for a choice of a threshold voltage which will allow a minimum of distortion of the 50% probability with minor threshold deviations.

The output of the filter network is utilized as the input to the first feedback amplifier stage 3, shown in block form in FIG. 1. The amplifier includes a transistor 42 having a collector 43, an emitter 46 and a base 47. The input to the amplifier is developed across a resistor 48 which is connected between the base 47 and ground. A bias resistor 51, with a parallel by-pass capacitor 52, is connected between the emitter 46 and ground. A feedback loop, for DC stability in operation of the transistor 42 during changes in temperature, interconnects the collector 43 and the base 47. The feedback loop includes two resistors 53 and 56 which are connected in series. The junction of these two resistors is connected to ground by means of a capacitor 57 which serves to eliminate any AC feedback. To supply a suitable operating load and bias, the collector 43 is connected to a negative voltage supply 58 by a resistor 61.

The output of the amplifier 3 is taken from the collector 43 of the transistor 42 and is coupled into a feedback amplifier stage 6 by means of a coupling capacitor 62. The feedback amplifier 6 is a standard feedback amplifier and is similar to the feedback amplifier 3. The amplifier 6 includes a transistor 63 having a collector 66, an emitter 67, and a base 68. The signal voltage to the transistor 63 is developed across resistor 71 which is connected between the base 68 and the ground. A bias resistor 72 and a by-pass capacitor 73, connected in parallel, are connected between the emitter 67 and the ground. A feedback loop, for DC stability and operation of the transistor 63 during changes in temperature, interconnects the collector 66 and the base 68. The feedback loop includes two resistors 76 and 77 which are connected in series. The junction of these two resistors is connected to ground by a capacitor 78 which serves to eliminate any AC feedback.

As shown in FIG. 1, the output of the amplifier 6 is applied to the gating means 7. This gating means includes a tuned transformer 81 which has two windings, a primary winding 81 and a secondary winding 83. One end of the primary winding 82 is connected to the collector 66 by a resistor 86, and the other end of the primary winding 82 is connected to the negative voltage supply 58. Connected to the output winding 83 of the transformer 81 are two diodes 88 and 91, each of which has an anode 92 and 93, respectively, and a cathode 96 and 97, respectively. The anode 92 is connected to one end of the secondary 83, and the anode 93 is connected to the other end of the secondary 83. A lead 98, connected to a center tap 101 of the secondary winding 83, interconnects the center tap 101 with the monostable multivibrator 8 shown in block form in FIG. 1. The two ends of the secondary winding 83 are connected by capacitor 87. The capacitor 87 permits tuning of the transformer 81 to the desired bandpass frequencies. The tuning of the transformer 81 serves to further filter the power spectrum of noise generating diode 13 for the purposes indicated hereinabove.

The monostable multivibrator 8 includes two transistors, 102 and 103, each of which has a collector, an emitter and a base, designated by the numerals 106, 107, 108, and 111, 112, 113, respectively. The base 108 is connected to the collector 111 of the transistor 103 by the parallel combination of a capacitor 116 and a resistor 117, and is further connected to a positive voltage supply 118 by a resistor 121. The emitter 107 is directly connected to ground, and the collector 106 is connected to a negative voltage supply 122 by a resistor 123. The base 113 of the transistor 103 is connected to the collector 106 of the transistor 102 by capacitor 126, and to the negative voltage 122 by resistor 125. The emitter 112 is connected directly to ground, and the collector 111 is connected to the negative voltage supply 122 by a resistor 124. A clock pulse is applied to the monostable multivibrator 8 at an input terminal 143 and is passed into a differentiation circuit consisting of a capacitor 146 and a resistor 147. The output of this circuit is passed through a diode 148, which connects the junction of the resistor 147 and the capacitor 146 with the base 113 of the transistor 103. The diode is so poled as to pass only positive-going pulses.

In operation, the transistor 102 of the monostable multivibrator 8 is normally non-conducting, and, therefore, the center tap 101 of the transformer 81 normally has a negative voltage applied to it over the lead 98. A clock pulse applied to the terminal 143 is passed through the differentiation circuit 146–147 and the diode 148 to the base 113, and triggers the monostable multivibrator 8 into its unstable state. Consequently, the transistor 103 becomes non-conductive, and the transistor 102 becomes conductive. At this time, the collector 106 will approach ground potential with the resultant fact that the center tap 101 will also approach ground potential. Diodes 91 and 88 are no longer reverse biased, and they will permit the passing therethrough of the output of the secondary 83. The operation of this gating circuit 7 will be described in greater detail later. Concerning the monostable multivibrator 8, it is sufficient to say that the monostable multivibrator 8 is standard in the art and operates in the usual manner.

The output of the entire random state generator is taken from the bistable multivibrator 12 shown in block form in FIG. 1 and in detail in FIG. 2. The bistable multivibrator 12 includes two transistors 151 and 152. Each transistor has a collector, emitter, and a base designated by the numerals 153, 156, 157 and 158, 161, 162, respectively. In standard fashion, the base 157 of the transistor 151 is connected to the collector 158 of the transistor 152 by a parallel combination of a resistor 163 and a capacitor 166. In a like manner, the base 162 of the transistor 152 is connected to the collector 153 of the transistor 151 by a parallel combination of a resistor 167 and a capacitor 168. Both the base 157 and the base 162 are connected to a positive power supply 171 by resistors 172 and 173, respectively. The collectors 153 and 158 of the transistors are connected to a negative voltage supply 174 by resistors 175 and 176, respectively. The negative voltage supply 174 and the positive supply 171 provide the necessary operating potentials for the bistable multivibrator 12. The bistable multivibrator 12, which has two stable states, has its output taken from the collector 158. The voltage level at an output lead 177, connected to the collector 158 of the transistor 152, is determined by whether the transistor 152 is conducting or non-conducting. The transistor of the bistable multivibrator 12 which conducts is determined by the last pulse applied to the bases of the transistors 151 and 152, during conduction of transistor 102, over a lead 178, which interconnects cathode 96 and base 157; and a lead 181, which interconnects cathode 97 and base 162.

In operation, noise generating diode 13 is continually generating a random variation of voltage. The diode is isolated by emitter follower 2 and amplified through the amplifier stages 3 and 6 until the amplified output is finally applied to the primary winding 82 of the transformer 81. The pulses which appear at the primary winding are transformed and appear in the secondary 83. They will be positive or negative at the ends of the secondary winding. The arrangement, of course, is such that if the voltage appearing at one end of the secondary 83 is positive the voltage appearing at the other end of the secondary 83 is negative. Consequently, with the poling of diodes 88 and 91 as they are shown in FIG. 2, only the positive-going pulses will pass through the diodes and, should the transistor 151 or 152 to which it is applied be conducting, it will turn off that transistor with the resultant turning on of the other transistor. If the transistor to which it is applied is non-conducting, the transistor will remain in the non-conducting state and the other transistor will remain in the conducting state. Nevertheless, for the positive-going pulses appearing in the secondary winding 82 of transformer 81 to pass on to the bistable multivibrator 12, the diodes 88 and 91 must be forward biased.

Forward biasing of the diodes 88 and 91 is achieved only during the period when the transistor 102 of the monostable multivibrator 8 is conducting, and the center tap connection 101 of the transformer secondary 83 is at ground potential. When the transistor 102 turns off, and the lead 98 again carries a negative voltage from negative voltage supply 122 to the center tap connection 101, the diodes 88 and 91 will be back-biased. Naturally, the back-biasing of the diodes 88 and 91 will open the gating means 7 and thereby prevent the further flow of pulses to the bistable multivibrator 12. The bistable multivibrator 12 will remain in the state which was determined by the last pulse which was applied over leads 178 and 181 to the bases of the transistors 151 and 152. To prevent noise from affecting the final state in which the bistable multivibrator 12 finds itself at times other than when transistor 102 is conducting, the negative power supply 122 causes the negative voltage applied at center tap 101 to be so negative that positive going noise pulses are too small to forward bias the two diodes 88 and 91 instantaneously. This arrangement prevents triggering the bistable multivibrator 12 into a different state, except during the desired clock time determined by transistor 102. Consequently, the gating means 7 insures that the random NRZ voltage level in the bistable multivibrator 12 is truly random and further prevents, by its filtering characteristics, the distortion which may occur when the randomly occurring voltage in the noise generating diode 13 is converted into a rondomly occurring voltage level in the bistable multivibrator 12.

The above description is of a preferred embodiment of the invention and numerous modifications could be made thereto without departing from the spirit and the scope of the invention which is limited only as defined in the appended claims. For example, one modification that may be made is that the feedback loop in the various amplification stages could be omitted entirely if silicon transistors are utilized. Or, as another example, different circuit configurations for the bistable multivibrator and the monostable multivibrator could easily be adapted for use in the system.

What is claimed is:

1. A random state generator comprising:
means for generating a randomly varying voltage, said voltage having positive- and negative-going variations;
gating means for controlling the flow therethrough of said positive- and negative-going variations, including a transformer having a primary winding with two ends, a secondary winding with two ends, and a secondary center tap connection, said primary winding ends being connected to said randomly varying voltage means and said center tap connection being connected to said actuating means;
a capacitor for tuning said transformer to a desired bandpass frequency and filtering a power spectrum generated by the randomly varying voltage means connecting said two said secondary winding ends, for minimizing distortion of said randomly varying voltage signal and yielding a ramdom gaussian distribution output across said secondary winding of the transformer; and
two diodes each having an anode and a cathode, each anode being connected to one of said two secondary winding ends, each cathode being connected to said state generating means;
actuating means for opening and closing said gating means; and
means connected to the output of said gating means, having two stable states, and controlled by said positive- and negative-going variations for generating one of said two states.

2. A random state generator comprising:
means for generating a randomly varying voltage, said voltage having positive- and negative-going variations;
gating means for controlling the flow therethrough of said positive- and negative-going variations, including a transformer having a primary winding with two ends, a secondary winding with two ends and a secondary center tap connection, said primary winding ends being connected to said randomly varying voltage means and said center tap connection being connected to said actuating means;

a means for tuning the transformer to a desired bandpass frequency and filtering a power spectrum generated by said randomly varying voltage means, connecting said two secondary winding ends, for minimizing distortion of said randomly varying voltage signal and yielding a random gaussian distribution output across said secondary winding of said transformer, and two diodes each having an anode and a cathode, each anode being connected to one of said two secondary winding ends, each cathode being connected to said state generating means;

actuating means for opening and closing said gating means; and means connected to the output of said gating means, having two stable states, and controlled by said positive- and negative-going variations for generating one of said two states.

3. A random state generator comprising:

means for generating a randomly varying voltage, said voltage having positive- and negative-going variations;

a network passive filtering means;

gating means for controlling the flow therethrough of said positive- and negative-going variations; wherein said gating means includes a tunable transformer means, said tunable transformer means and said network passive filtering means minimizing distortion of said randomly varying voltage signal and yielding a random gaussian distribution of the voltage;

actuating means for opening and closing said gating means; and means connected to the output of said gating means, having two stable states, and controlled by said positive- and negative-going variations for generating one of said two states.

4. A random state generator comprising:

means for generating a randomly varying voltage, said voltage having positive- and negative-going variations;

gating means for controlling the flow therethrough of said positive- and negative-going variations;

actuating means for opening and closing said gating means, including a means for generating positive- and negative-going pulses, said gating means opening when a positive-going pulse is received from said actuating means and closing when a negative-going pulse is received from said actuating means, and means connected to the output of said gating means, having two stable states, and controlled by said positive- and negative-going variations for generating one of said two states.

* * * * *